US012702017B2

(12) United States Patent
Choi et al.

(10) Patent No.: US 12,702,017 B2
(45) Date of Patent: Aug. 4, 2026

(54) SEMICONDUCTOR DEVICE AND SEMICONDUCTOR CHIP

(71) Applicant: Samsung Electronics Co., Ltd., Suwon-si (KR)

(72) Inventors: Jimin Choi, Suwon-si (KR); Joongwon Shin, Suwon-si (KR); Sungyun Woo, Suwon-si (KR); Yeonjin Lee, Suwon-si (KR); Jongmin Lee, Suwon-si (KR); Sehyun Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 461 days.

(21) Appl. No.: 18/313,491

(22) Filed: May 8, 2023

(65) Prior Publication Data

US 2024/0038675 A1      Feb. 1, 2024

(30) Foreign Application Priority Data

Jul. 28, 2022      (KR) ........................ 10-2022-0093654

(51) Int. Cl.

| | |
|---|---|
| *H10W 90/00* | (2026.01) |
| *H10B 80/00* | (2023.01) |
| *H10W 46/00* | (2026.01) |
| *H10W 90/20* | (2026.01) |

(52) U.S. Cl.
CPC ............ *H10W 46/00* (2026.01); *H10B 80/00* (2023.02); *H10W 90/00* (2026.01); *H10W 46/301* (2026.01); *H10W 90/291* (2026.01); *H10W 90/722* (2026.01)

(58) Field of Classification Search
CPC ... H01L 23/544; H01L 25/0657; H01L 25/18; H01L 2223/54426; H01L 2225/06513; H01L 2225/06582; H01L 2225/06593; H01L 22/34; H01L 23/3121; H01L 2223/5448; H01L 2223/5442; H01L 2223/5446; H10B 80/00

See application file for complete search history.

(56) References Cited

U.S. PATENT DOCUMENTS

| | | | |
|---|---|---|---|
| 8,970,050 | B2 | 3/2015 | Lee |
| 9,024,456 | B2 | 5/2015 | Yang et al. |
| 9,159,675 | B2 | 10/2015 | Han et al. |
| 9,666,522 | B2 | 5/2017 | Huang et al. |

(Continued)

FOREIGN PATENT DOCUMENTS

| | | |
|---|---|---|
| CN | 103019052 A | 4/2013 |
| CN | 107104063 A | 8/2017 |
| KR | 2010/0010841 A | 2/2010 |

OTHER PUBLICATIONS

TW Office Action and Search Report for corresponding Taiwan Patent Application No. 112118255 issued on May 31, 2024.

*Primary Examiner* — Elias Ullah
(74) *Attorney, Agent, or Firm* — Harness, Dickey & Pierce, P.L.C.

(57) ABSTRACT

A semiconductor device may include a plurality of chip regions on a substrate, at least one scribe lane surrounding each of the plurality of chip regions on the substrate, a plurality of first align key patterns and a plurality of first test element group patterns included in the plurality of chip regions, and a plurality of second align key patterns and a plurality of second test element group patterns included in the at least one scribe lane.

20 Claims, 12 Drawing Sheets

(56)            References Cited

U.S. PATENT DOCUMENTS

2012/0225538  A1      9/2012  Kim et al.
2017/0125364  A1      5/2017  Cho et al.
2020/0126927  A1 *    4/2020  Kim ................... H01L 23/3171
2022/0068829  A1      3/2022  Park et al.

* cited by examiner

TEG        TEG

TEG        TEG

TEG        TEG

TEG

TEG 110a    100    110b    120a    102

22

106    20    102    120a

TEG                    120b

TEG

TEG                    110b 100    110a

FIG. 8

SEMICONDUCTOR DEVICE AND SEMICONDUCTOR CHIP

CROSS-REFERENCE TO RELATED APPLICATION

This U.S. non-provisional application claims the benefit of priority under 35 USC § 119 to Korean Patent Application No. 10-2022-0093654, filed on Jul. 28, 2022, in the Korean Intellectual Property Office (KIPO), the contents of which are incorporated by reference herein in their entirety.

BACKGROUND

Various example embodiments relate to a semiconductor device. More particularly, one or more example embodiments relate to a semiconductor device including align key patterns and/or test element group (TEG) patterns, a system including the semiconductor device, and/or a method of manufacturing the semiconductor device, etc.

In order to reduce undesired and/or unnecessary areas of a substrate for manufacturing a semiconductor device, layouts of a semiconductor chip may be variously developed. In order to form more semiconductor chips in one substrate, layouts of elements formed on the substrate may be desired and/or required to be improved and/or optimized.

SUMMARY

Various example embodiments provide a semiconductor device including align key patterns and test element group (TEG) patterns, a system including the semiconductor device, and/or a method of manufacturing the semiconductor device, etc.

Various example embodiments provide a semiconductor chip including align key patterns and test element group (TEG) patterns, etc.

According to some example embodiments, there is provided a semiconductor device. The semiconductor device may include a plurality of chip regions on a substrate, at least one scribe lane surrounding each of the plurality of chip regions on the substrate, a plurality of first align key patterns and a plurality of first test element group (TEG) patterns included in the plurality of chip regions, and a plurality of second align key patterns and a plurality of second test element group patterns included in the at least one scribe lane.

According to some example embodiments, there is provided a semiconductor device. The semiconductor device may include a plurality of unit devices, a shot group of a substrate, the shot group including a plurality of chip regions, the shot group having an area covered by a single shot of a photolithography process, a first region included in each of the chip regions, the first region including at least one of a plurality of first align key patterns and a plurality of first test element group patterns, and a main region included in each of the chip regions, the main region including the unit devices, the plurality of first align key patterns included in the chip regions of the shot group include a plurality of align key patterns used in different exposure processes, and the plurality of test element group patterns included in the chip regions of the shot group include a plurality of patterns configured to provide a plurality of different tests of the plurality of unit devices.

According to some example embodiments, there is provided a semiconductor chip. The semiconductor chip may include a plurality of unit devices, a chip region, at least one scribe lane surrounding the chip region, a first region included in the chip region, the first region including a plurality of first align key patterns and a plurality of first test element group patterns, and a main region included in the chip region, the main region including the plurality of unit devices.

In some example embodiments, the first align key patterns and first TEG patterns may be included in the chip regions of the semiconductor device. Accordingly, all of the align key patterns and TEG patterns used in manufacturing the semiconductor device may be included within a shot group.

BRIEF DESCRIPTION OF THE DRAWINGS

Various example embodiments will be more clearly understood from the following detailed description taken in conjunction with the accompanying drawings. FIGS. 1 to 16 represent non-limiting, example embodiments as described herein.

FIG. 1 is a plan view illustrating a substrate including shot groups in accordance with one or more example embodiments;

FIG. 2 is a plan view illustrating semiconductor chips in one shot group in accordance with one or more example embodiments;

FIG. 3 is an enlarged plan view of a portion of semiconductor chips in a shot group in accordance with one or more example embodiments;

FIG. 4 is an enlarged plan view of a portion of an individual semiconductor chip in accordance with one or more example embodiments;

FIG. 5 is a plan view illustrating semiconductor chips included in one shot group in accordance with one or more example embodiments;

FIG. 6 is an enlarged plan view of a portion of semiconductor chips included in a shot group in accordance with one or more example embodiments;

FIG. 7 is an enlarged plan view of a portion of an individual semiconductor chip in accordance with one or more example embodiments;

FIG. 8 is a plan view illustrating semiconductor chips included in one shot group in accordance with one or more example embodiments;

FIG. 9 is an enlarged plan view of a portion of semiconductor chips in a shot group in accordance with one or more example embodiments;

FIG. 10 is an enlarged plan view of a portion of semiconductor chips in a shot group in accordance with one or more example embodiments;

FIGS. 11 to 15 are plan views illustrating individual semiconductor chips in accordance with some example embodiments, respectively; and FIG. 16 is a cross-sectional view of a semiconductor package in accordance with one or more example embodiments.

DETAILED DESCRIPTION

Hereinafter, various example embodiments of the inventive concepts will be described in detail with reference to the accompanying drawings.

Hereinafter, a direction parallel to a surface of a substrate is referred to as a first direction, and a direction parallel to the surface of the substrate and perpendicular to the first direction is referred to as a second direction.

Figure 1:
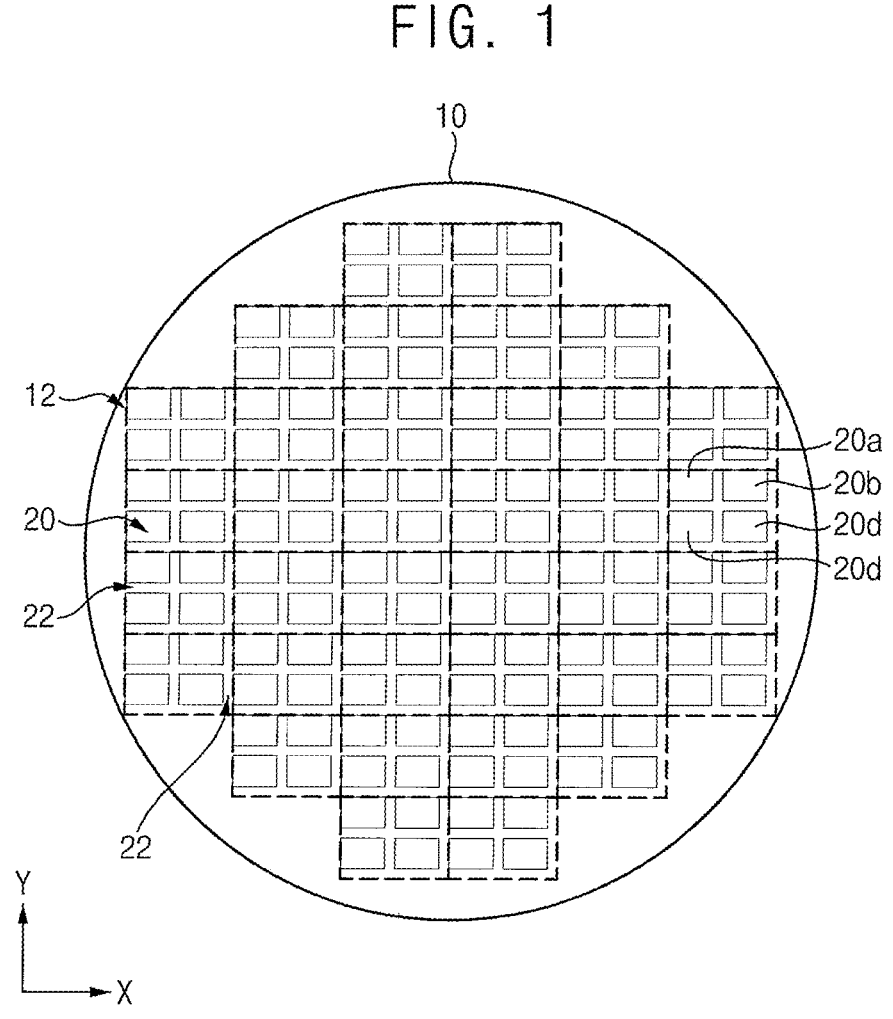
Figure 2:
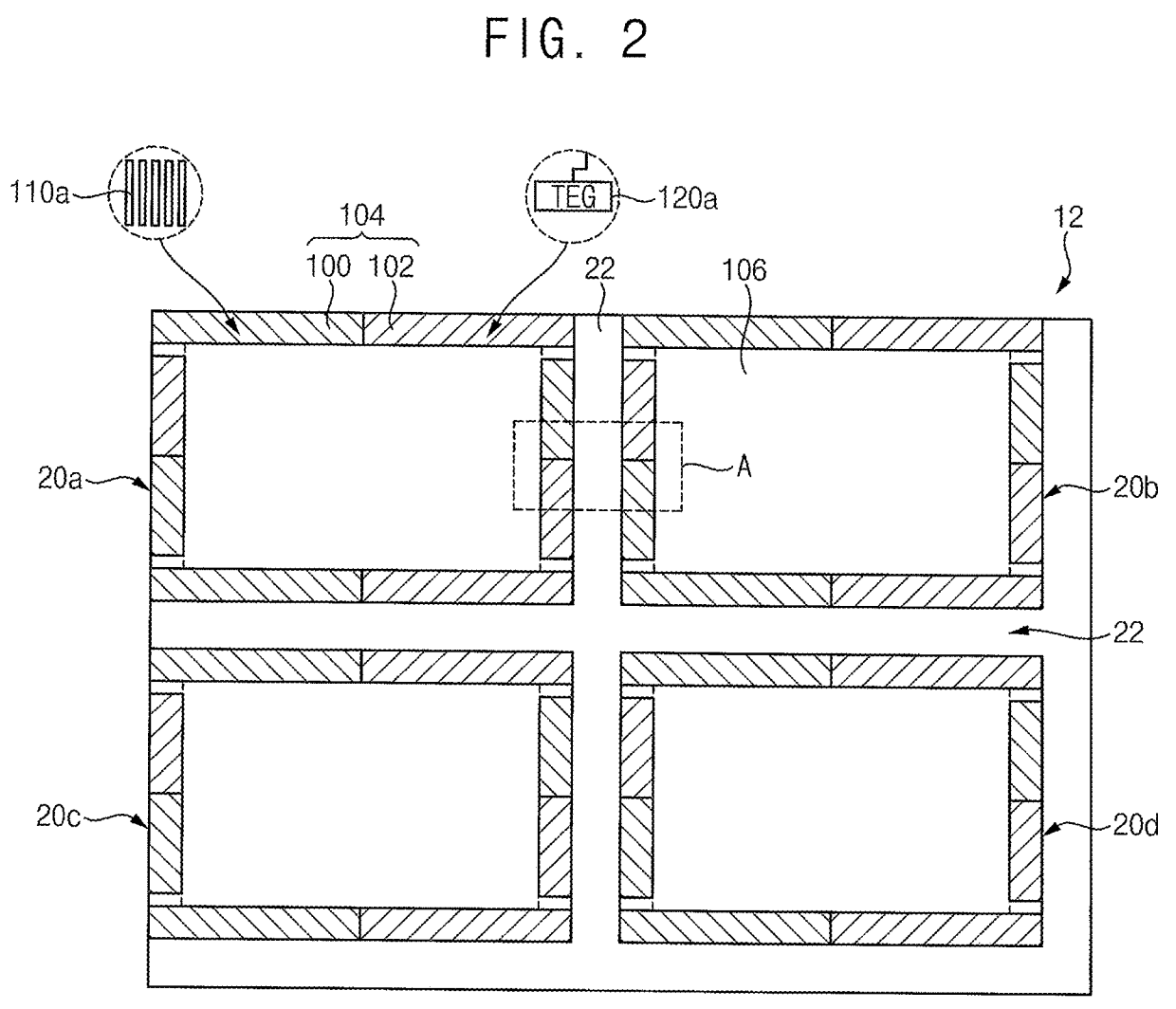
Figures 3, 4:
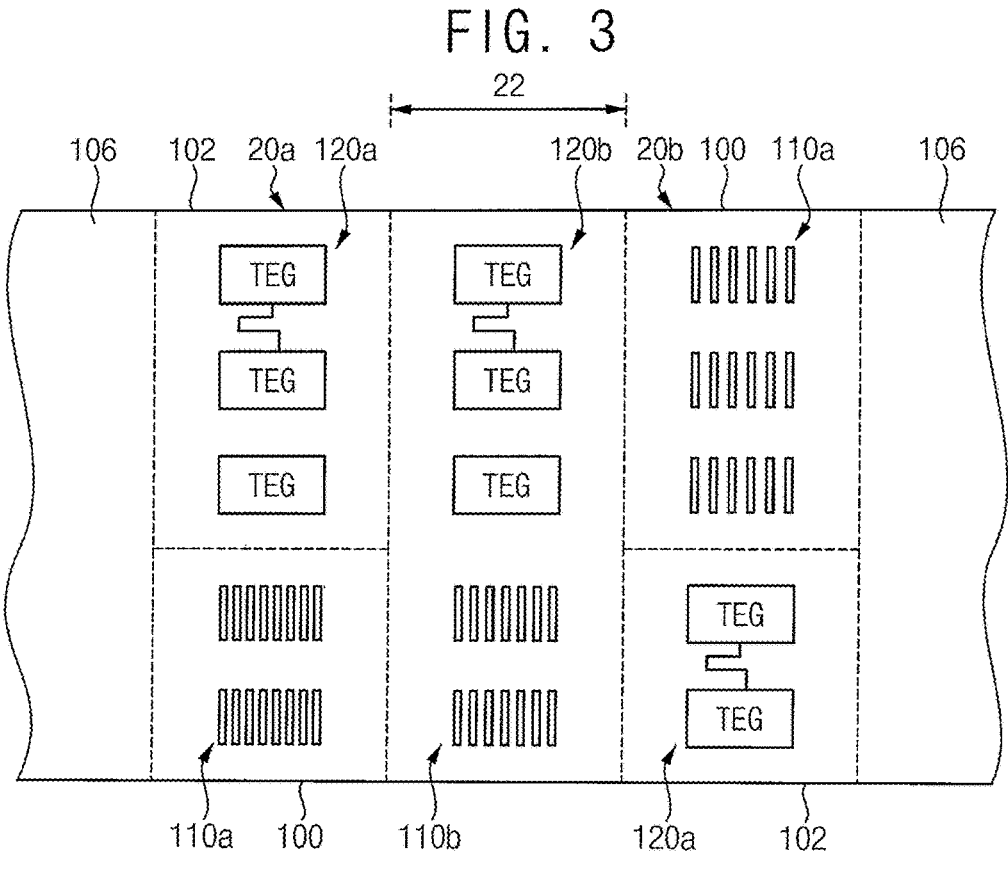

FIG. 1 is a plan view illustrating a substrate including shot groups in accordance with one or more example embodiments. FIG. 2 is a plan view illustrating semiconductor chips in one shot group in accordance with one or more example embodiments. FIG. 3 is an enlarged plan view of a portion of semiconductor chips in a shot group in accordance with one or more example embodiments, and more specifically, FIG. 3 is an enlarged plan view of area A in FIG. 2.

FIG. 4 is an enlarged plan view of a portion of an individual semiconductor chip in accordance with one or more example embodiments.

Referring to FIGS. 1 to 4, a plurality of shot groups 12 may be included in a substrate 10, but the example embodiments are not limited thereto. Each of shot groups 12 may include a plurality of chip regions 20 formed by a single exposure (e.g., one shot) of a ultra-violet (UV) light during a photolithography process. In other words, each shot group encompasses a physical area of the substrate which is the same area covered by a single exposure of UV light during the photolithography process, etc. The shot groups 12 may be continuously included on the substrate 10 in the first direction X and/or the second direction Y, but is not limited thereto.

The chip regions 20 included in each of the shot groups 12 may be arranged in the first direction X and the second direction Y. If the number of chip regions included in each of the shot groups 12 is two, the chip regions may be arranged in the first direction (X) or the second direction (Y), but the example embodiments are not limited thereto. The number of chip regions 20 included in each of the shot groups 12 may not be limited, and may be greater than or less than what is shown in FIGS. 1 to 4, etc. In some example embodiments, for example, four chip regions 20 arranged in two rows and two columns may be included in each of the shot groups 12, but the example embodiments are not limited thereto. In some example embodiments, six chip regions arranged in two rows and three columns may be included in each of the shot groups 12, but the example embodiments are not limited thereto.

When the number of chip regions included in the shot group 12 decreases, a size of the semiconductor chip may increase. On the other hand, when the number of chip regions included in the shot group 12 decreases, an area of a scribe lane between the chip regions may decrease.

In the following description, the shot group 12 of the example embodiments is assumed to include four chip regions 20 for the sake of clarity and brevity of description, but the example embodiments are not limited thereto, and shot groups may include a greater or lesser number of chip regions. The four chips regions 20 are referred to as first to fourth chip regions 20a, 20b, 20c, and 20d, respectively.

The semiconductor device may be formed in each of the chip regions 20. In some example embodiments, the semiconductor device may include a logic device, but is not limited thereto. Unit devices (e.g., elements, components, etc.) comprising the semiconductor device may be formed in the chip regions 20. In some example embodiments, the unit devices comprising the semiconductor device may include transistors, capacitors, wires, resistors, diodes, or the like.

The semiconductor device formed in each of the chip regions 20 is also referred to as a semiconductor chip, etc.

In addition to the unit devices comprising the semiconductor device, first align key patterns 110a and/or first test element group patterns 120a (hereinafter referred to as TEG patterns) may be further included in the chip regions 20. That is, both of the first align key patterns 110a and the first TEG patterns 120a may be included in each of the first to fourth chip regions 20a, 20b, 20c, and 20d, etc., but the example embodiments are not limited thereto.

A first region 104 in which the first align key patterns 110a and the first TEG patterns 120a are formed may be included in each of the chip regions 20, or in other words, the first region 104 may include the first align key patterns 110a and the first TEG patterns 120a, and each of the chip regions 20 may include a first region 104, etc. The first region 104 may include an align key pattern region 100 for forming the first align key patterns 110a, and a TEG pattern region 102 for forming the first TEG patterns 120a. A region other than the first region 104 in each of the chip regions 20 may be defined as a main region 106. The unit devices (e.g., integrated circuits, etc.) comprising the semiconductor device may be included in the main region 106.

Positions of the align key pattern regions 100 in each of the chip regions 20 may not be limited to the positions shown in FIGS. 1 to 4. For example, the align key pattern region 100 may not be at a specific position in each of the chip regions 20, but may be at an arbitrary position in each of the chip regions 20, etc.

All of the align key patterns (e.g., alignment key patterns, etc.) used in exposure processes for manufacturing the semiconductor device may be included within the shot groups 12. As the semiconductor device is highly integrated, processes for manufacturing the semiconductor device may be complicated. Accordingly, the number of alignment key patterns used in manufacturing the semiconductor device may increase. The align key patterns may include, e.g., an overlay key, an align key, or the like.

In some example embodiments, first align key patterns 110a formed in each of the first to fourth chip regions 20a, 20b, 20c, and 20d in the shot group 12 may include align key patterns used in and/or for different exposure processes. Accordingly, the shapes of the first align key patterns 110a formed in the align key pattern regions 100 in each of the first to fourth chip regions 20a, 20b, 20c, and 20d may be different from each other, but the example embodiments are not limited thereto.

In some example embodiments, the first align key patterns 110a may have a structure in which a line and a space are repeatedly and/or alternately arranged, but is not limited thereto. In the first align key patterns 110a, the sizes and directions of the lines and/or spaces may be variously modified.

The positions of the TEG pattern regions 102 in each of the chip regions 20 may not be limited to the positions shown in the FIGS. 1 to 4. The TEG pattern region 102 may not be at a specific position in each of the chip regions 20, but may be at an arbitrary position in each of the chip regions 20, etc.

As such, the align key pattern region 100 and/or the TEG pattern region 102 may be at arbitrary positions within each of the chip regions 20, and thus the first region 104 may be at arbitrary positions within each of the chip regions 20, etc. For example, the first region 104 may not be as shown in FIG. 2.

In some example embodiments, the first region 104 may be at the same position in each of the chip regions 20 included in the shot group 12, but is not limited thereto. That is, the first region 104 may be at the same position in each of the first to fourth chip regions 20a, 20b, 20c, and 20d, etc.

The TEG patterns may be provided to test the unit devices included in the semiconductor device, so that the TEG patterns may include unit devices which are the same as the unit devices included in the semiconductor device. In other words, the TEG patterns are configured to provide testing capabilities of the unit devices of the semiconductor device and/or the semiconductor device itself, etc. In some example embodiments, the TEG patterns may include transistors, capacitors, wires, diodes, resistors, or the like. As the semiconductor device is highly integrated, the number of unit devices included in the semiconductor device increases. Accordingly, the number of TEG patterns in the shot group 12 for tests of the semiconductor device may also increase.

Each of TEG patterns may be numbered according to and/or based on the kind and/or type of the TEG patterns. In some example embodiments, the first TEG patterns 120a formed in the TEG pattern region 102 in each of the first to fourth chip regions 20a, 20b, 20c, and 20d of the shot group 12 may include test patterns for different tests of the semiconductor device (e.g., the shot group may include a plurality of test patterns configured to provide a plurality of different tests for the semiconductor device and/or unit devices of the semiconductor device, etc.), but the example embodiments are not limited thereto. For example, the first TEG patterns 120a numbered 1 to 80 may be included in the first to fourth chip regions 20a, 20b, 20c, and 20d, but the example embodiments are not limited thereto. In this case, the first TEG patterns 120a numbered 1 to 20 may be formed in and/or included in the first chip region 20a. The first TEG patterns 120a numbered 21 to 40 may be formed in and/or included in the second chip region 20b. The first TEG patterns 120a numbered 41 to 60 may be formed in and/or included in the third chip region 20c. The first TEG patterns 120a numbered 61 to 80 may be formed in and/or included in the fourth chip region 20d. However, the example embodiments are not limited thereto, and for example, the number of first TEG patterns included in each chip region may be greater than or less than 20 and/or the number of first TEG patterns included in a first chip region may be different from the number of first TEG patterns included in a second chip region, etc.

In some example embodiments, some of the first TEG patterns 120a formed in and/or included in the TEG pattern region 102 in each of the first to fourth chip regions 20a, 20b, 20c, and 20d of the shot group 12 may be identical to each other, but are not limited thereto. For example, some of the first TEG patterns 120a may be important test patterns that need to be further tested in a state after an individual semiconductor chip has been cut, removed, and/or sawed from the substrate, etc. The important test patterns may be included in all of the first to fourth chip regions 20a, 20b, 20c, and 20d, but the example embodiments are not limited thereto.

The scribe lane 22 may be between the chip regions 20. The scribe lane 22 may surround each of the chip regions 20, but is not limited thereto. The scribe lane 22 may include a first lane extending parallel to the first direction X and a second lane extending parallel to the second direction Y, but is not limited thereto. In some example embodiments, a width of the first lane and a width of the second lane may be equal to each other, but are not limited thereto. The chip regions 20 within the shot group 12 may be defined by the scribe lane 22, respectively.

At least one of a second align key pattern 110b and a second TEG pattern 120b may be included in the scribe lane 22, but the example embodiments are not limited thereto. For example, as shown in FIG. 3, both of the second align key pattern 110b and the second TEG pattern 120b may be included in the scribe lane 22. In some example embodiments, only the second align key pattern 110b may be included in the scribe lane 22. In some example embodiments, only the second TEG pattern 120b may be included in the scribe lane 22.

When the number of align key patterns and/or TEG patterns used in manufacturing the semiconductor device is large, the first align key patterns 110a and the first TEG patterns may be formed in each of the chip regions 20, but the example embodiments are not limited thereto. In addition, at least one of the second align key patterns 110b and the second TEG patterns 120b may be included in the scribe lane 22. Accordingly, all of align key patterns and TEG patterns used in manufacturing the semiconductor device may be formed in the shot groups 12 of the substrate 10, etc., but are not limited thereto.

After the semiconductor device is formed in each of the chip regions 20, the substrate may be sawed along the scribe lane 22 to form individual semiconductor chips.

The individual semiconductor chip may include the chip region 20 and a partially remaining scribe lane (e.g., a remaining portion and/or excess portion of the scribe lane following the sawing of the substrate) surrounding the chip region 20. As shown in FIG. 4, a cutting portion (e.g., a cut portion, a remainder portion, etc.) of at least one of the second align key patterns 110b and the second TEG patterns 120b may be detected in the partially remaining scribe lane (e.g., cutting scribe lane and/or cut scribe lane, etc.) of the individual semiconductor chip, but the example embodiments are not limited thereto.

Figure 5:
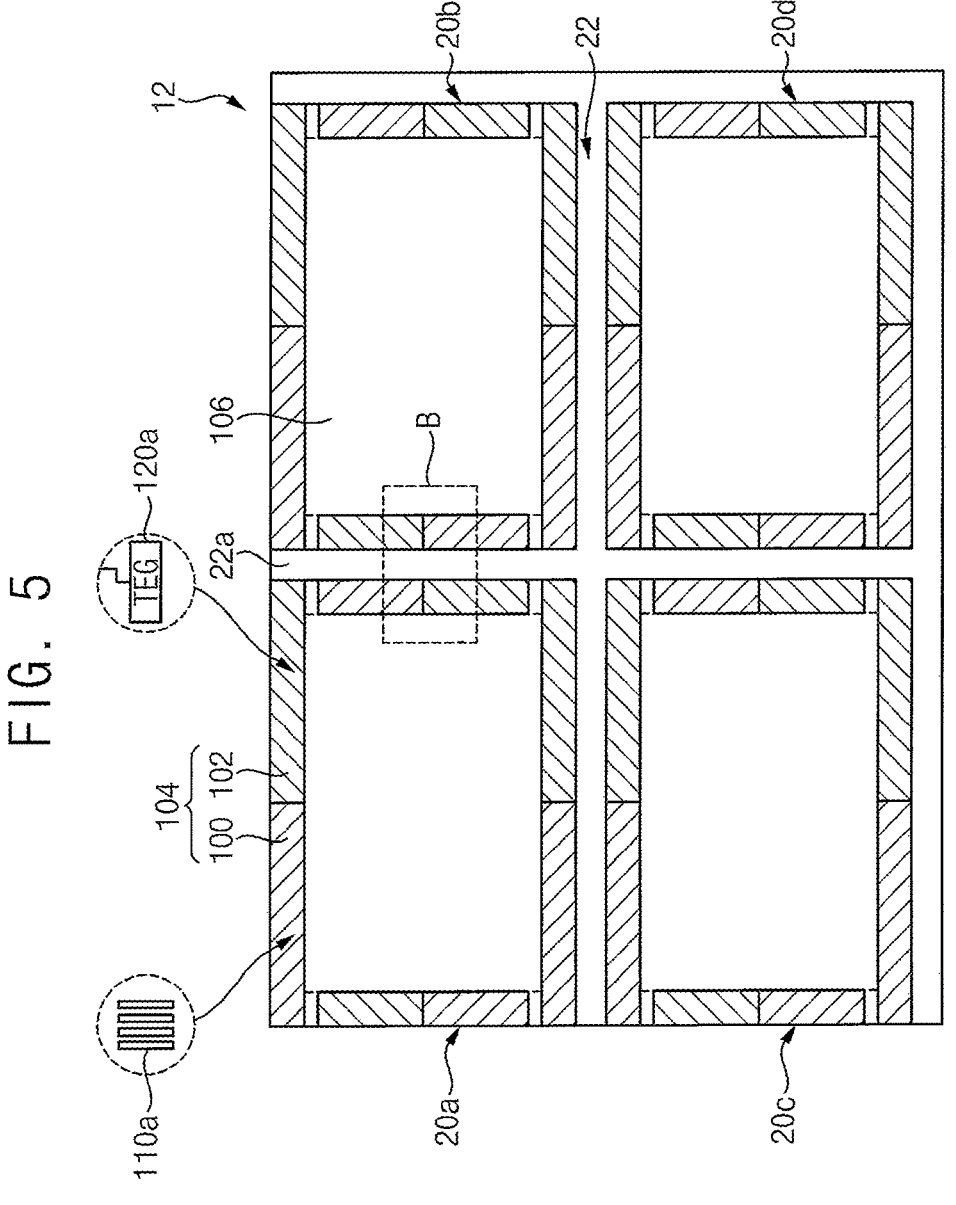
Figure 6:
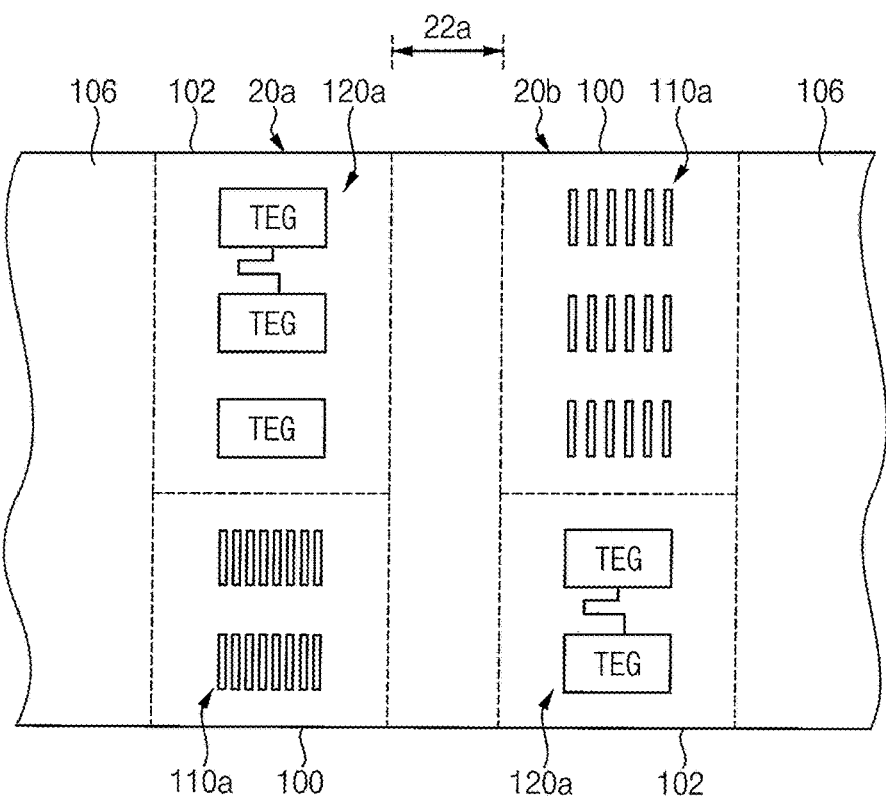
Figure 7:
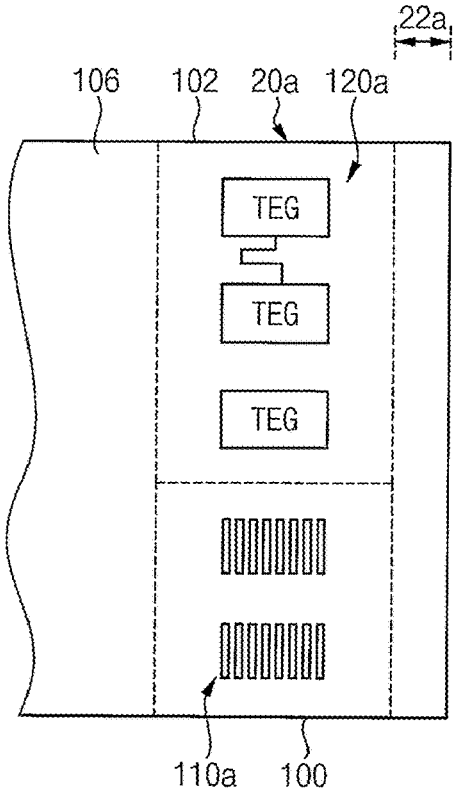

FIG. 5 is a plan view illustrating semiconductor chips included in one shot group in accordance with one or more example embodiments. FIG. 6 is an enlarged plan view of a portion of semiconductor chips included in a shot group in accordance with one or more example embodiments. FIG. 7 is an enlarged plan view of a portion of an individual semiconductor chip in accordance with one or more example embodiments.

FIG. 6 is an enlarged plan view of area B in FIG. 5 according to at least one example embodiment.

Referring to FIGS. 5 to 7, unit devices comprising the semiconductor device may be formed in each of the chip regions 20 of the shot group 12, and the first align key patterns 110a and the first TEG patterns may be further formed in each of the chip regions 20 of the shot group 12, but the example embodiments are not limited thereto.

Align key pattern regions 100 for forming the first align key patterns 110a may be included in each of the chip regions 20. Also, TEG pattern regions 102 for forming the first TEG patterns 120a may be included in each of the chip regions 20.

The first align key patterns 110a formed in each of the chip regions 20 may be the same and/or substantially the same as those described with reference to FIGS. 1 to 4, but the example embodiments are not limited thereto. The first TEG pattern 120a formed in each of the chip regions 20 may be the same and/or substantially the same as that described with reference to FIGS. 1 to 4, but the example embodiments are not limited thereto.

A scribe lane 22a may be between the chip regions 20. The scribe lane 22a may surround each of the chip regions 20, but is not limited thereto.

Patterns may not be formed in the scribe lane 22a. In some example embodiments, the align key patterns and TEG patterns may not be formed in (e.g., are omitted from) the scribe lane 22a, but the example embodiments are not limited thereto.

Therefore, as shown in FIG. 7, a cutting portion of the align key patterns and TEG patterns may not be detected in a partially remaining scribe lane (e.g., an excess remaining scribe lane after the sawing of the substrate 10) surrounding the chip region 20 in an individual semiconductor chip.

The scribe lane 22a may only need to have a sufficient width for sawing the substrate 10 in forming the individual semiconductor chip. In some example embodiments, the width of the scribe lane 22a may be smaller than a width desired and/or required to form the align key patterns and TEG patterns in the scribe lane 22a, but is not limited thereto.

As the width of the scribe lane 22a decreases, an area of the substrate 10 serving as each of the chip regions 20 may be increased. Accordingly, as the width of the scribe lane 22a decreases, the number of chip regions 20 that can be formed in the substrate 10 may increase.

In some example embodiments, the align key patterns and TEG patterns used in manufacturing the semiconductor device may be included in each of chip regions of the shot group. Positions of the align key patterns and TEG patterns in each of the chip regions may be variously modified.

Figure 8:
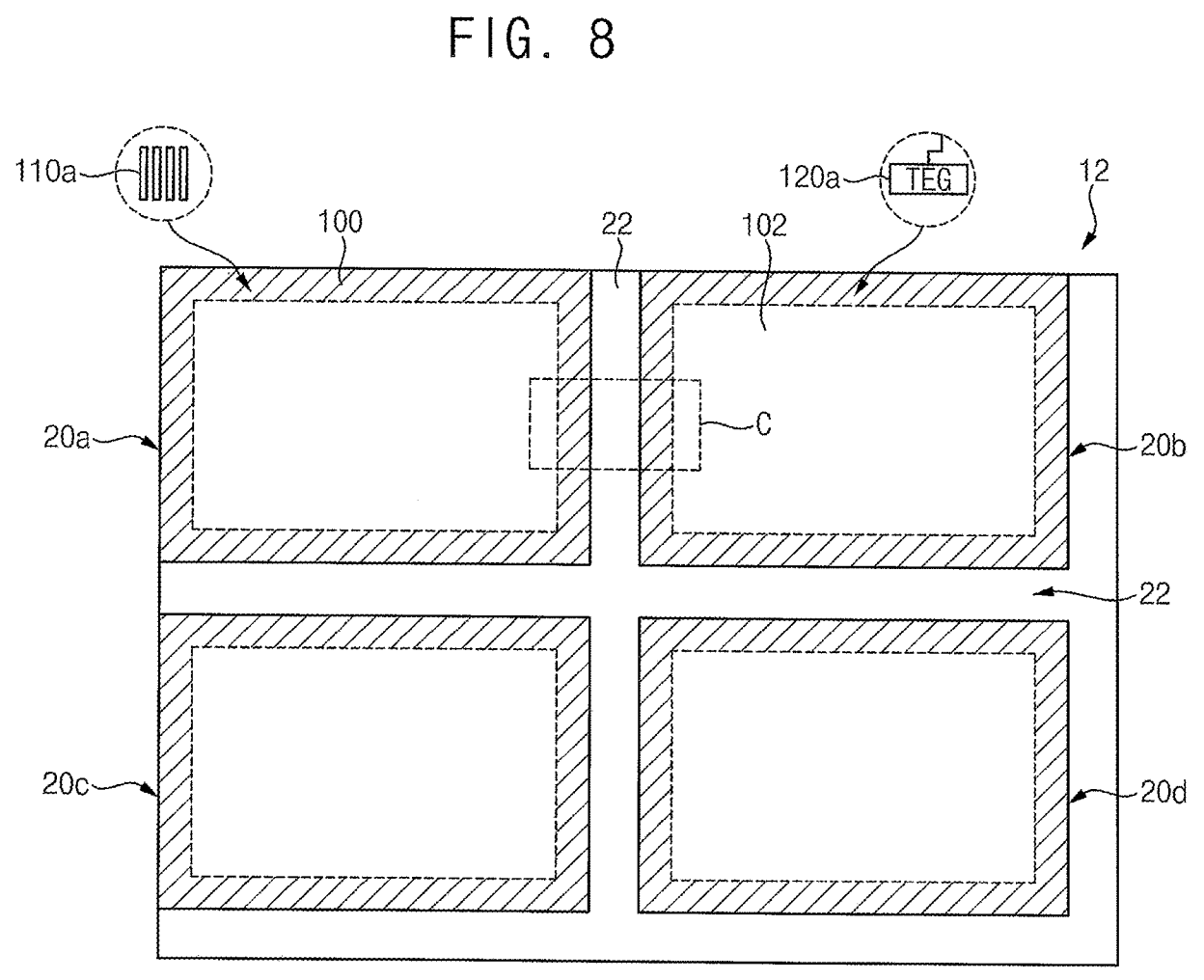
Figure 9:
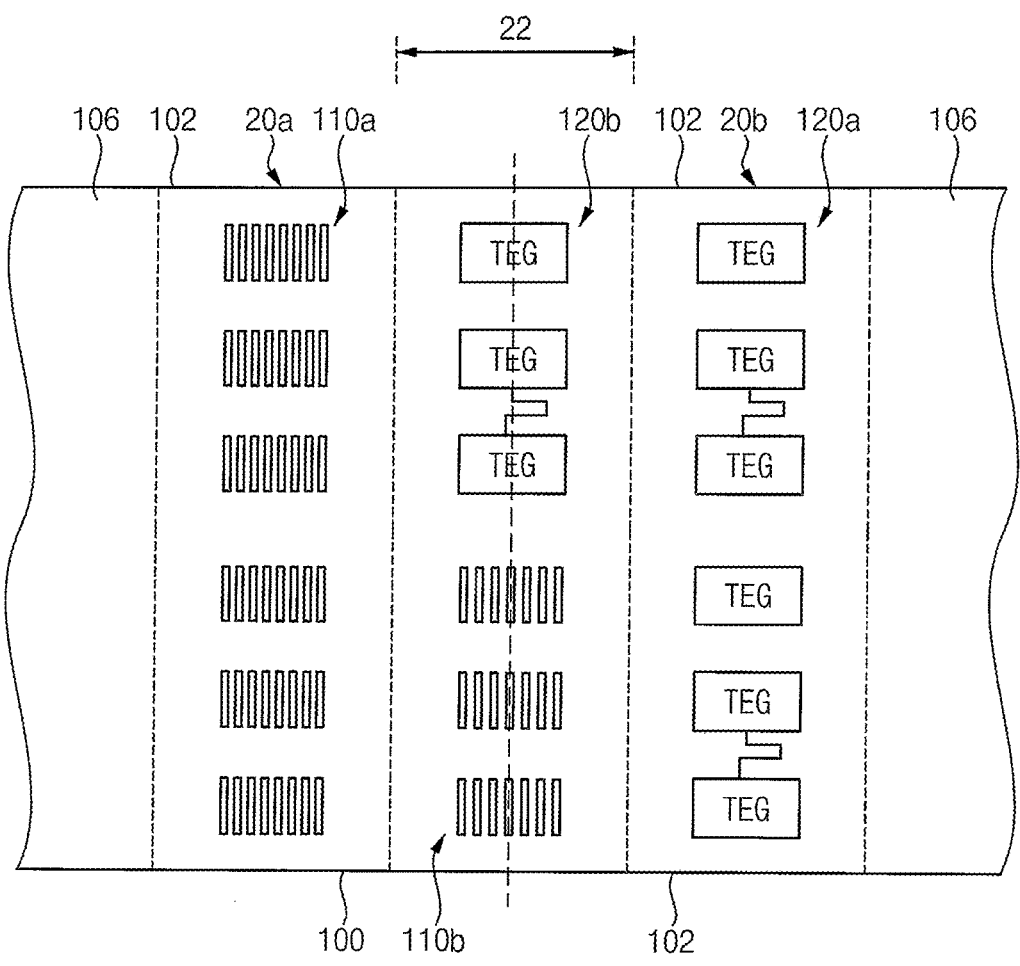

FIG. 8 is a plan view illustrating semiconductor chips included in one shot group in accordance with one or more example embodiments. FIG. 9 is an enlarged plan view of a portion of semiconductor chips in a shot group in accordance with one or more example embodiments.

FIG. 9 is an enlarged plan view of area C in FIG. 8, but the example embodiments are not limited thereto.

Referring to FIGS. 8 and 9, unit devices comprising semiconductor devices may be included in each of the chip regions 20 of the shot group 12.

The first align key patterns 110a may be included in one or more of the chip regions of the shot group 12, but is not limited thereto. The first TEG patterns 120a may be included in other chip regions of the shot group 12, etc. In other words, the chip regions of the shot group 12 may include at least one of the first align key patterns 110a or the first TEG patterns 120a, or both of the first align key patterns 110a and the first TEG patterns 120a.

For example, the first align key patterns 110a may be included in the first and third chip regions 20a and 20c, and the first TEG patterns 120a may be included in the second and fourth chip regions 20b and 20d. In this case, the align key pattern region 100 in which the first align key patterns 110a are formed may be included in each of the first and third chip regions 20a and 20c. The TEG pattern region 102 in which the first TEG patterns 110a are formed may be included in each of the second and fourth chip regions 20b and 20d. The first TEG patterns 120a may not be included in (e.g., are omitted from) the first and third chip regions 20a and 20c. The first align key patterns 110a may not be included in (e.g., are omitted from) the second and fourth chip regions 20d.

The first align key patterns 110a formed in each of the first and third chip regions 20a and 20c may be the same as those described with reference to FIGS. 1 to 4, but the example embodiments are not limited thereto. The first TEG pattern 120a formed in each of the second and fourth chip regions 20b and 20d may be the same as that described with reference to FIGS. 1 to 4, but the example embodiments are not limited thereto.

As such, each of the chip regions 20 in the shot group 12 may include the first align key patterns 110a or the first TEG patterns 120a, but are not limited thereto.

The scribe lane 22 may be between the chip regions 20. The scribe lane 22 may surround each of the chip regions 20, but is not limited thereto.

At least one of second align key patterns 110b and second TEG patterns 120b may be included in the scribe lane 22. For example, both of the second align key patterns 110b and second TEG patterns 120a may be included in the scribe lane 22. For some example embodiments, only the second TEG patterns 120a may be included in the scribe lane 22 and the second align key pattern 110b is omitted from the scribe lane 22, etc. For some example embodiments, only the second align key pattern 110b may be included in the scribe lane 22 and the second TEG patterns 120a are omitted from the scribe lane 22, etc.

After the semiconductor device is formed in each of the chip regions 20, the substrate may be sawed along the scribe lane 22 to form individual semiconductor chips. A cutting portion of at least one of the second align key pattern 110b and the second TEG patterns 120b may be detected in partially remaining scribe lane surrounding the chip region 20 of the individual semiconductor chip.

Figure 10:
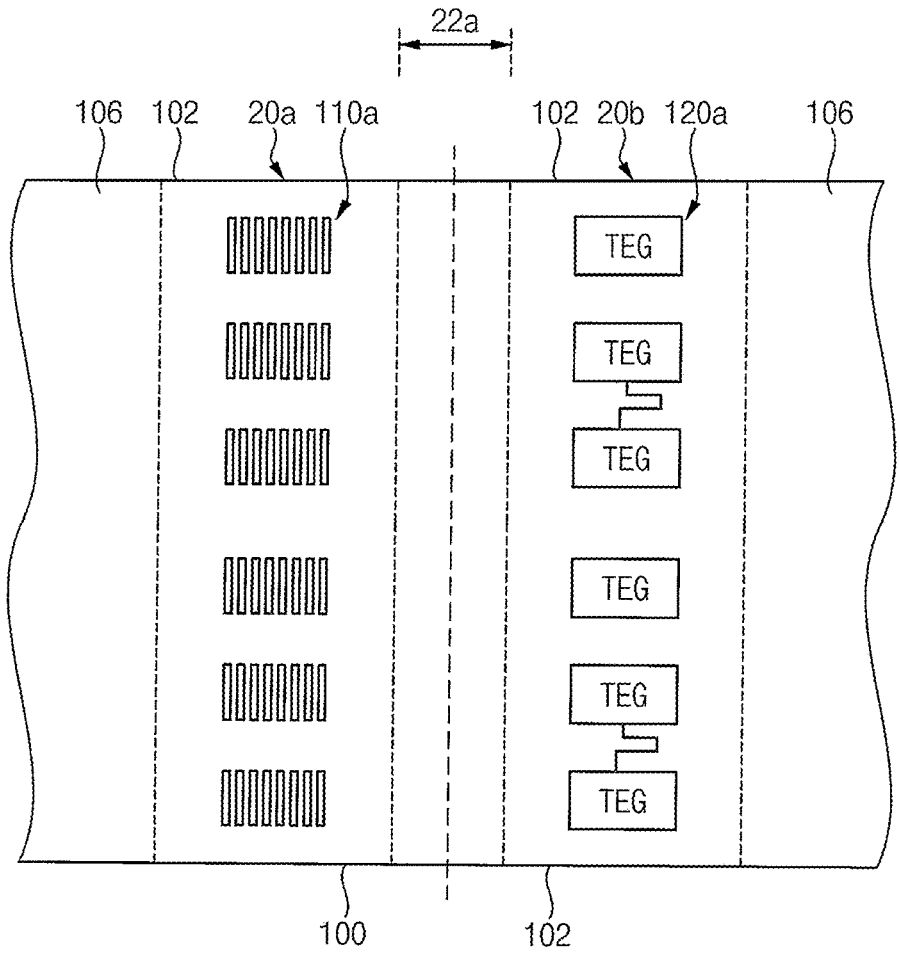

FIG. 10 is an enlarged plan view of a portion of semiconductor chips in a shot group in accordance with one or more example embodiments.

Referring to FIG. 10, the chip regions in the shot group may be the same and/or substantially the same as those described with reference to FIGS. 8 and 9, but the example embodiments are not limited thereto.

The scribe lane 22a may be between the chip regions 20, but is not limited thereto. The scribe lane 22a may surround each of the chip regions 20, but is not limited thereto. Patterns may not be formed in the scribe lane 22a. For example, align key patterns and TEG patterns may not be formed in the scribe lane 22a, but the example embodiments are not limited thereto.

After the semiconductor device is formed in the chip region 20, the substrate may be sawed and/or cut along the scribe lane 22a to form individual semiconductor chips. Cutting portion of the align key pattern and the TEG patterns may not be detected in partially remaining scribe lane surrounding the chip region 20 of the individual semiconductor chip.

The scribe lane 22a may only need to have a sufficient width for sawing the substrate 10 for forming the individual semiconductor chip. In some example embodiments, the width of the scribe lane 22a may be smaller than a width required to form the align key patterns and TEG patterns in the scribe lane 22a, but the example embodiments are not limited thereto.

As such, the align key patterns and TEG patterns may be included in the chip region of the shot group. Positions of the align key pattern region and the TEG pattern region in each of chip regions of the shot group may be variously modified.

In the following description, the align key pattern region and/or the TEG pattern region may be merged into a first region.

FIGS. 11 to 15 are plan views illustrating individual semiconductor chips in accordance with some example embodiments, respectively.

Figure 11:
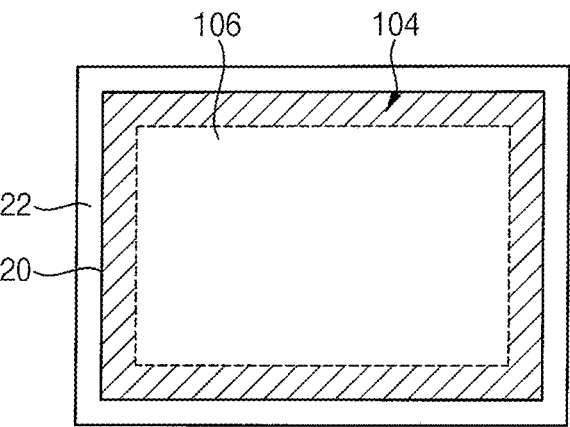

Referring to FIG. 11, an individual semiconductor chip may include a chip region 20 and/or a cutting scribe lane 22(e.g., partially remaining scribe lane 22) surrounding the chip region 20, but the example embodiments are not limited thereto.

The first region 104 may surround an inner edge of the chip region 20. That is, the first region 104 may have a rectangular ring shape, but is not limited thereto, and for example, may have a circular shape, polygonal shape, etc.

Figure 12:
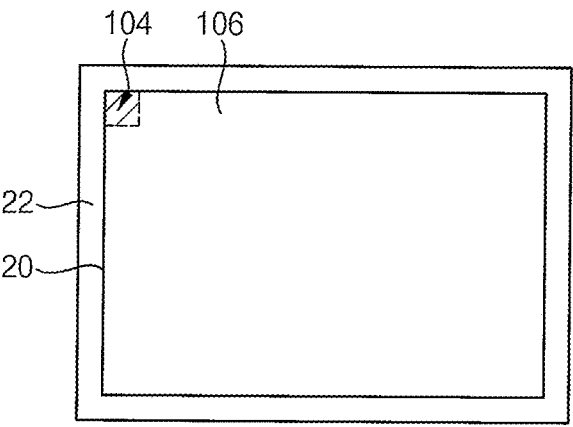
Figure 13:
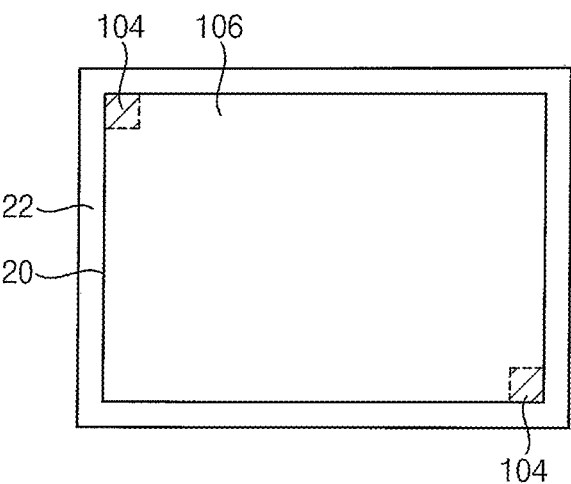

Referring to FIGS. 12 and 13, the first region 104 may be included in at least one of corner of an inner edge of the chip region 20. In a plan view, the corners may be adjacent to a vertex of the chip region 20.

For example, as shown in FIG. 12, the first region 104 may be at one corner of the chip region 20, but is not limited thereto. For example, as shown in FIG. 13, the first regions 104 may be at two corners of the chip region 20, but is not limited thereto. Although not shown, the first region may be at three or four corners, etc.

Figure 14:
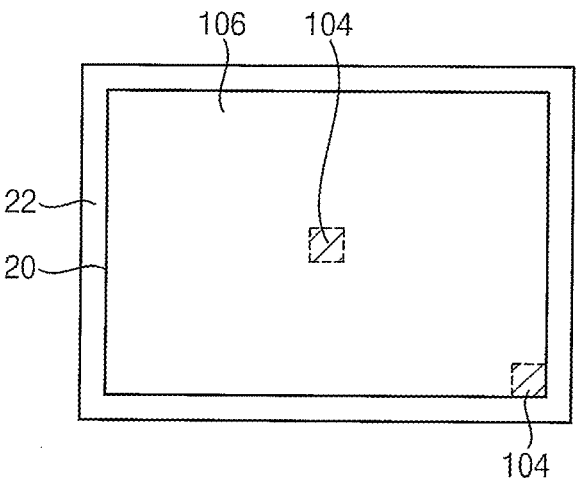

Referring to FIG. 14, the first region 104 may be at a central portion in the chip region 20, but is not limited thereto. The first region 104 may be further included in at least one of corner of an inner edge of the chip region 20, but is not limited thereto.

Figure 15:
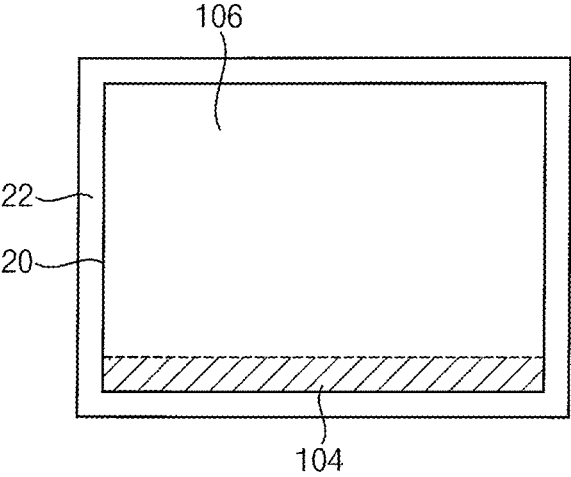

Referring to FIG. 15, the first region 104 may be along at least one side of an edge of the chip region 20, etc. For example, as shown in FIG. 15, the first region 104 may be along one side portion of the chip region 20. Although not shown, first regions may be along at least two side portions of the chip region, etc.

Positions of the first region are shown as examples in FIGS. 11 to 15, but the positions of the first region are not limited thereto. The first region may be at any positions within the chip region.

Figure 16:
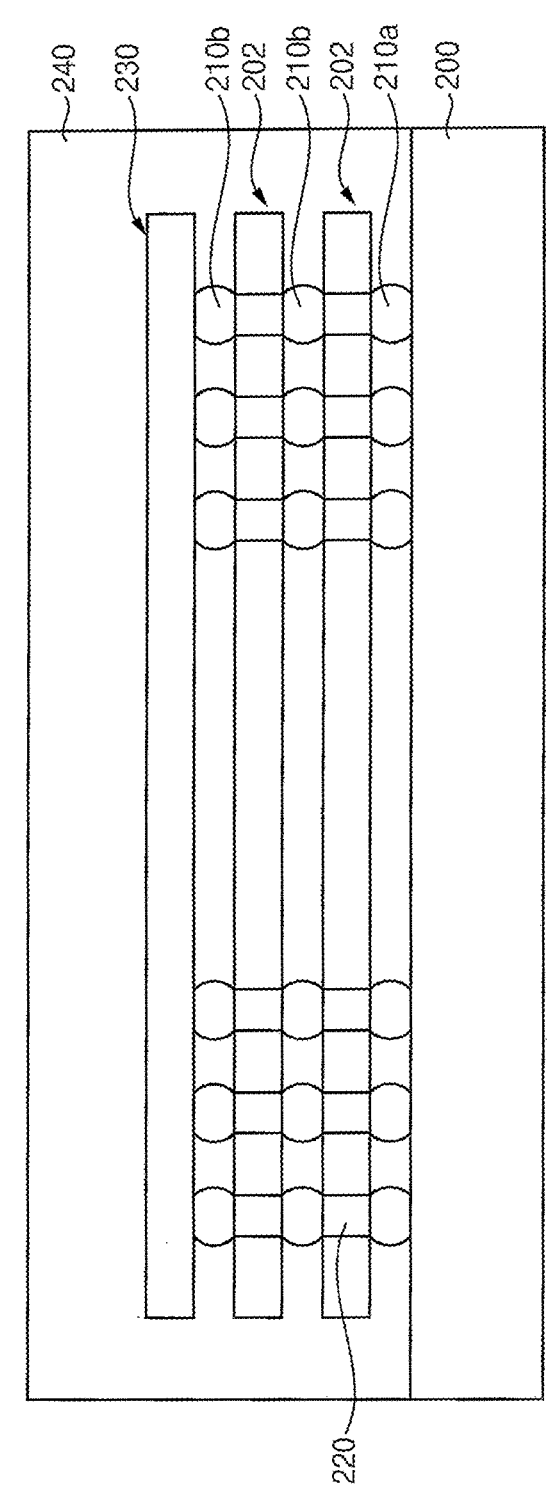

FIG. 16 is a cross-sectional view of a semiconductor package in accordance with one or more example embodiments.

The semiconductor package may include a high-bandwidth memory (HBM) device in which memory chips stacked, but the example embodiments are not limited thereto.

Referring to FIG. 16, the semiconductor package 250 may include a package substrate 200, and a first semiconductor chip 202, a second semiconductor chip 230, and/or a molding member 240 sequentially stacked on the package substrate 200, etc., but the example embodiments are not limited thereto. The semiconductor package 250 may further include a plurality of conductive bumps 210a and 210b and/or external connection terminals (not shown), etc., but is not limited thereto.

The package substrate 200 may be a printed circuit board (PCB) including circuit patterns therein, but is not limited thereto. A plurality of substrate pads may be formed on an upper surface of the package substrate 200, and external connection terminals such as solder balls may be formed on a lower surface of the package substrate 200, etc.

The first semiconductor chip 202 may be a memory semiconductor chip, but is not limited thereto. The memory semiconductor chip 202 may be, e.g., a volatile memory semiconductor chip such as, dynamic random access memory (DRAM) and/or static random access memory (SRAM), etc., and/or a non-volatile memory semiconductor chip such as phase-change random access memory (PRAM), MRAM (Magnetoresistive Random Access Memory), Ferroelectric Random Access Memory (FeRAM), and/or Resistive Random Access Memory (RRAM), etc. A through silicon via contact 220 may be included in the first semiconductor chip 202.

The first semiconductor chip 202 may be stacked in one layer or in multiple layers. In FIG. 16, the first semiconductor chip 202 is shown as being stacked in two layers. However, it is not limited thereto.

The second semiconductor chip 230 may be a logic semiconductor chip, but the example embodiments are not limited thereto. The second semiconductor chip 230 may be electrically connected to the first semiconductor chip 202, and may control operations such as input/output of signals in the first semiconductor chip 202, etc. In some example embodiments, the second semiconductor chip 230 may be positioned at a lowermost level or an uppermost level in the semiconductor package 250, but is not limited thereto. In FIG. 16, the second semiconductor chip 230 may be positioned at the uppermost level in the semiconductor package 250. However, it is not limited thereto.

The second semiconductor chip 230 may include one of the semiconductor chips in accordance with some example embodiments. The second semiconductor chip 230 may include a chip region and/or a cutting scribe lane surrounding the chip region, but the example embodiments are not limited thereto.

The chip region of the second semiconductor chip 230 may include unit devices for comprising a semiconductor device (e.g., a logic device, etc.).

At least one of an align key region and/or a TEG pattern region may be included in the chip region of the second semiconductor chip 230, but the example embodiments are not limited thereto. Accordingly, at least one of align key patterns and TEG patterns may be included in the second semiconductor chip.

In some example embodiments, in the second semiconductor chip 230, cutting align key patterns and/or cutting TEG patterns may be included in the cutting scribe lane surrounding the chip region. In some example embodiments, the align key patterns and/or the TEG patterns may not be in the cutting scribe lane surrounding the chip region in the second semiconductor chip 230, or in other words, the align key patterns and/or the TEG are omitted from the cutting scribe lane.

The first conductive bumps 210a may be included between the package substrate 200 and the first semiconductor chip 202. The first conductive bump 210a may be electrically connected with the substrate pad of the package substrate 200 and a first bonding pad (not shown) of the first semiconductor chip 202, but is not limited thereto.

The second conductive bumps 210b may be included between the first semiconductor chips 202 and between the first semiconductor chip 202 and the second semiconductor chip 230, but the example embodiments are not limited thereto. In some example embodiments, the second conductive bump 210b may be electrically connected with bonding pads of the first semiconductor chip 202 and bonding pads (not shown) of the second semiconductor chip 230 to each other. In some example embodiments, the second conductive bumps 210b may be omitted, and, for example, the second bonding pad of the first semiconductor chip 202 and the first bonding pad of the second semiconductor chip 230 may be directly bonded to each other, etc.

The molding member 240 may be formed on the package substrate 200 to cover the first and second semiconductor chips 202 and 230, etc. The molding member 240 may include an epoxy molding compound (EMC) material, but is not limited thereto.

In a case of the semiconductor package 250, sizes of the first and second semiconductor chips 202 and 230 may be the same and/or substantially similar to each other (e.g., the sizes may be within +/−10% of each other). As the size of the first semiconductor chip 202 serving as a memory semiconductor chip is increased, the size of the second semiconductor chip 230 serving as a logic device may be also increased, but the example embodiments are not limited thereto.

Accordingly, in processes of manufacturing the second semiconductor chip 230, at least one of align key patterns and TEG patterns may be included in the chip region. Even if the number of align key patterns and TEG patterns used in manufacturing the second semiconductor chip increases, all of the align key patterns and TEG patterns may be formed in the shot groups of the substrate.

The foregoing is illustrative of various example embodiments of the inventive concepts and are not to be construed as limiting the inventive concepts. Although a few example embodiments have been described, those of ordinary skill in the art will readily appreciate that modifications are possible in the example embodiments without materially departing from the novel teachings and advantages of the inventive concepts. Accordingly, all such modifications are intended to be included within the scope of the inventive concepts as defined in the claims. Therefore, it is to be understood that the foregoing is illustrative of various example embodiments and the inventive concepts are not to be construed as limited to the specific example embodiments disclosed, and that modifications to the disclosed example embodiments, as well as other example embodiments, are intended to be included within the scope of the appended claims.

What is claimed is:

1. A semiconductor device, comprising:

a plurality of chip regions on a substrate, each chip region of the plurality of chip regions including at least one circuit pattern for at least one integrated circuit device;

at least one scribe lane surrounding each chip region of the plurality of chip regions on the substrate;

a plurality of first align key patterns and a plurality of first test element group patterns included in the plurality of chip regions when viewed from a vertical direction; and a plurality of second align key patterns and a plurality of second test element group patterns included in the at least one scribe lane when viewed from the vertical direction, wherein the plurality of chip regions are separated from each other along the at least one scribe lane.

2. The semiconductor device of claim 1, wherein a subset of chip regions of the plurality of chip regions are included in a shot group, the shot group having an area covered by a single exposure in a photolithography process; and the plurality of first align key patterns and the plurality of first test element group patterns are included in each chip region of the subset of chip regions of the shot group.

3. The semiconductor device of claim 2, wherein each of the plurality of first align key patterns included in each chip region of the subset of chip regions of the shot group include a plurality of align key patterns used in different exposure processes; and the plurality of first test element group patterns included in each of the subset of chip regions of the shot group include a plurality of test patterns configured to provide a plurality of different tests of the semiconductor device.

4. The semiconductor device of claim 1, wherein a first subset of chip regions of the plurality of chip regions are included in a shot group, the shot group having an area covered by a single exposure in a photolithography process;

the plurality of first align key patterns are included in the first subset of chip regions of the shot group; and the plurality of first test element group patterns included in a second subset of chip regions of the plurality of chip regions of the shot group, the second subset of chip regions being different than the first subset of chip regions.

5. The semiconductor device of claim 1, further comprising:

a first region including the plurality of first align key patterns and the plurality of first test element group patterns, the first region being included at arbitrary positions within each chip region of the plurality of chip regions.

6. The semiconductor device of claim 5, wherein the first region is at the same position within each chip region of the plurality of chip regions.

7. The semiconductor device of claim 5, wherein the first region has a rectangular ring shape surrounding at least one edge of each chip region of the plurality of chip regions.

8. The semiconductor device of claim 5, wherein the first region is at a corner of an inner edge within each chip region of the plurality of chip regions.

9. The semiconductor device of claim 5, wherein the at least one integrated circuit device is a plurality of integrated circuit devices; and the plurality of integrated circuit devices are included in a main region in each chip region of the plurality of chip regions, the main region being different than the first region in each chip region of the plurality of chip regions.

10. A semiconductor device, comprising:

a plurality of integrated circuit devices;

a shot group of a substrate, the shot group including a plurality of chip regions, the shot group having an area covered by a single shot of a photolithography process;

at least one scribe lane on the substrate, the at least one scribe lane surrounding the plurality of chip regions;

a first region included in each chip region of the plurality of chip regions, the first region including at least one of a plurality of first align key patterns and a plurality of first test element group patterns when viewed from a vertical direction; and a main region included in each chip region of the plurality of chip regions, the main region including the plurality of integrated circuit devices, the plurality of first align key patterns included in the plurality of chip regions of the shot group include a plurality of align key patterns used in different exposure processes, and the plurality of first test element group patterns included in the plurality of chip regions of the shot group include a plurality of patterns configured to provide a plurality of different tests of the plurality of integrated circuit devices, wherein the plurality of chip regions are separated from each other along the at least one scribe lane.

11. The semiconductor device of claim 10, wherein the at least one scribe lane includes at least one of a plurality of second align key patterns and a plurality of second test element group patterns.

12. The semiconductor device of claim 10, wherein the at least one scribe lane does not include a plurality of second align key patterns and a plurality of second test element group patterns.

13. The semiconductor device of claim 10, wherein each chip region of the plurality of chip regions include the plurality of first align key patterns and the plurality of first test element group patterns.

14. The semiconductor device of claim 10, wherein the shot group includes a first subset of chip regions and a second subset of chip regions;

the first subset of chip regions includes the plurality of first align key patterns; and the second subset of chip regions includes the plurality of first test element group patterns.

15. The semiconductor device of claim 10, wherein the first region is at arbitrary positions within each chip region of the plurality of chip regions.

16. The semiconductor device of claim 10, wherein the first region is at the same position within each chip region of the plurality of chip regions.

17. A semiconductor chip, comprising:

a plurality of integrated circuit devices;

a chip region;

at least one scribe lane surrounding the chip region;

a first region included in the chip region, the first region including a plurality of first align key patterns and a plurality of first test element group patterns when viewed from a vertical direction; and a main region included in the chip region, the main region including the plurality of integrated circuit devices, wherein the chip region is separated from other chip regions along the at least one scribe lane.

18. The semiconductor chip of claim 17, wherein the at least one scribe lane includes at least one of cut portions of a plurality of second align key patterns and cut portions of a plurality of second test element group patterns.

19. The semiconductor chip of claim 17, wherein the at least one scribe lane does not include a plurality of second align key patterns and a plurality of second test element group patterns.

20. The semiconductor chip of claim 17, wherein the first region is at an arbitrary position within the chip region.

* * * * *